United States Patent
Vasishta et al.

(10) Patent No.: US 7,098,528 B2
(45) Date of Patent: Aug. 29, 2006

(54) EMBEDDED REDISTRIBUTION INTERPOSER FOR FOOTPRINT COMPATIBLE CHIP PACKAGE CONVERSION

(75) Inventors: Ronnie Vasishta, Mt. View, CA (US); Stan Mihelcic, Pleasanton, CA (US)

(73) Assignee: LSI Logic Corporation, Milpitas, CA (US)

(*) Notice: Subject to any disclaimer, the term of this patent is extended or adjusted under 35 U.S.C. 154(b) by 191 days.

(21) Appl. No.: 10/744,363

(22) Filed: Dec. 22, 2003

(65) Prior Publication Data

US 2005/0133935 A1    Jun. 23, 2005

(51) Int. Cl.
  *H01L 29/40* (2006.01)
  *H01L 23/31* (2006.01)
  *H01L 23/48* (2006.01)
  *H05K 1/14* (2006.01)
  *H05K 3/34* (2006.01)

(52) U.S. Cl. .............. 257/668; 257/E23.004; 257/E23.061; 257/E23.063; 257/E25.023; 257/686; 257/691; 257/685; 257/777; 257/738; 257/737; 257/684; 257/786

(58) Field of Classification Search ......... 257/685, 257/686, 668, 723, 724, 728, 777, 778, 784, 257/786, 780, 782, 737, 738, 734, 690–693, 257/698, 783, E23.063, E23.004, E23.061, 257/E25.023
See application file for complete search history.

(56) References Cited

U.S. PATENT DOCUMENTS

| 6,455,936 | B1* | 9/2002 | Lo et al. ............ 257/758 |
| 6,476,500 | B1* | 11/2002 | Kimura ............ 257/777 |
| 6,734,553 | B1* | 5/2004 | Kimura ............ 257/723 |
| 6,756,664 | B1* | 6/2004 | Yang ............ 257/691 |
| 6,847,105 | B1* | 1/2005 | Koopmans ............ 257/686 |
| 6,861,761 | B1* | 3/2005 | Yang et al. ............ 257/777 |
| 6,889,429 | B1* | 5/2005 | Celaya et al. ............ 29/840 |
| 2003/0089868 | A1* | 5/2003 | Ito et al. ............ 251/100 |
| 2003/0153122 | A1* | 8/2003 | Brooks ............ 438/107 |
| 2003/0230796 | A1* | 12/2003 | Ismail et al. ............ 257/686 |

(Continued)

FOREIGN PATENT DOCUMENTS

JP    5-21495    * 1/1993

*Primary Examiner*—Alexander Oscar Williams
(74) *Attorney, Agent, or Firm*—Strategic Patent Group

(57) ABSTRACT

An embedded redistribution interposer is disclosed for providing footprint compatible chip package migration in which a die designed to be mounted into chip package is originally implemented using a first type of silicon platform and is subsequently redesigned for a second type of silicon platform, resulting in a redesigned die being a different size than the original die and no longer compatible for mounting in the chip package. According to the present invention, the embedded redistribution interposer includes a substrate having a plurality of bond pads on a top side thereof, wherein the redesigned die is mounted to the top of the interposer substrate, and the bottom of the interposer substrate is mounted to the substrate of the chip package. The redesigned die is connected to the redistribution interposer via a first set of electrical connections coupled between the die and the interposer bond pads. The redistribution interposer is then connected to the package via a second set of electrical connections coupled between the interposer bond pads and a package substrate, wherein signals from the die are redistributed in a manner that increases die fan-out without violating assembly rules, thereby eliminating the need to redesign the chip package to accommodate the redesigned die, resulting in a footprint compatible package.

19 Claims, 5 Drawing Sheets

U.S. PATENT DOCUMENTS

2003/0232462 A1* 12/2003 Poo et al. .................. 438/117
2004/0033673 A1*  2/2004 Cobbley et al. ............ 438/455
2004/0124539 A1*  7/2004 Yang et al. ................. 257/777
2004/0150084 A1*  8/2004 Nishida et al. ............. 257/678

* cited by examiner

US 7,098,528 B2

EMBEDDED REDISTRIBUTION INTERPOSER FOR FOOTPRINT COMPATIBLE CHIP PACKAGE CONVERSION

FIELD OF THE INVENTION

The present invention relates to integrated circuit chip migration, and more particularly to an embedded redistribution interposer for providing footprint compatible chip package conversion.

BACKGROUND OF THE INVENTION

A chip package is a housing used to encapsulate an integrated circuit die for plugging into (socket mount) or soldering onto (surface mount) a printed circuit board. Most chip packages are constructed with the die mounted on a package substrate with signals from the die connected to conductive lines or traces on the surface of the package. The die or chips within the package may be wire bond or flip-chip interconnected to the die.

FIG. 1 is a cross-section view of a conventional wire bond package. A wire-bond package 10 is constructed with a die 12 mounted on a substrate 14 face-up (can also be face down) with wire bonds 16 connected between bond pads (not shown) on the die 12 and bond pads (or fingers) (not shown) on the package substrate 14.

FIG. 2 is a cross-section view of a conventional flip-chip package. A flip-chip package 20 has solder balls (also known as solder bumps) 22 placed on the (active) surface of the die 24, and the die 24 is "flipped" over onto the package substrate 26 and connected to the package via the solder balls 22. In both FIGS. 1 and 2, after the packages 10 and 20 are assembled, the packages 10 and 20 are surface mounted to a printed circuit (PCB) board 30 by metal leads (not shown) or solder balls 28.

The current trend with both types of package technologies is towards the production of custom chip designs in which a customer contracts with a chip manufacture to produce a custom chip package. There are a number of different types of silicon platforms in existence from which to fabricate the chips. Examples of different types of silicon platforms include FPGA (Field Programmable Grid Array), platform or structured ASICs, and cell-based ASICs. As different silicon platforms become more prevalent, customers are looking for ways to migrate chip designs between platforms in which one type of platform is used for prototyping or limited production, and a lower-cost platform is used to implement high-volume production.

For example, a chip design may be first implemented as an FPGA, which is typically large and expensive, in situations where the design is unproven or demand for the chip is unknown. Once a determination is made to mass-produce the design, the customer may migrate the FPGA design to an ASIC platform, which is an overall lower-cost solution in high-volume environments. Besides converting an existing FPGA design to ASIC, customers may also convert a platform/structured ASIC design to a full cell-based ASIC, for instance.

Rapidchip is another type of silicon platform where a reference chip design serves as a starting point for the design of custom chips. A design produced as a rapidchip may be used as a development vehicle in situations where it is critical to prove a product design or that a market exists for that product. If the market is successful, then the design will be converted to ASIC to lower overall product cost.

When a chip design is redesigned from one silicon platform to another, e.g., from FPGA or platform ASIC to a full cell-based ASIC, the area of the die is dramatically reduced. The result of this die size reduction makes it challenging to interconnect the redesigned die to the package that was designed for the original die. A package has a pin-out comprising pins, leads or balls at fixed locations corresponding to signal I/Os and power and ground. When a chip is redesigned from one silicon platform to another, the locations of those pins have to be the same on a converted package to maintain footprint compatibility. Footprint compatibility enables the customer to use the cost reduced chip design in the existing PCB board. However, assembly rules place limitations on design parameters such as, wire length, wire angle, loop height, wire pitch, bond finger pitch, and radial fan-out. With relatively large die, assembly rules are easier to meet. When a chip is redesigned and made smaller, however, I/O density and routing congestion increases, reducing the possibility of assembly rule compliance. If any of the pin locations of the package need to be altered to accommodate the redesigned die, then footprint compatibility is lost.

FIG. 3 is a diagram illustrating one example of a package design issue that can arise during die migration of a die to a smaller die. A top view of a redesigned die 40 is shown to illustrate that to due assembly rules, a decrease in die size results in reduced signal fan-out. The dashed boundary lines 42 show available radial fan-out angles for the routing of wire bonds from the die 40 to the package substrate. In this example, the fan-out rules are met when all bond wires from the side of the die can be routed to the substrate within the two boundary lines 42. The first three arced lines showing bond wire connection locations on the substrate meet the fan-out rules. Due to the small form factor die, however, some bond wires fan out past the boundary lines 40, resulting in violation of the fan-out rules (assembly rules), as shown by the last arced line. In such a case, the redesigned die 40 may force a redesign of the chip package, resulting in footprint incompatibility.

Losing footprint compatibility with the original chip package in this manner is disadvantageous because the PCB board to which the original chip package was to attach must also be redesigned to accommodate the new package footprint. Such redesigns may add months of engineering time to a project and significantly impact both costs and the time to market.

One solution to avoid having to redesign the PCB board is a daughter card approach in which a daughter card is inserted between the redesigned package and the PCB board to act as a bridge between the old and new connections. This solution is inadequate because it still requires a redesign of the original chip package, and is not cost-effective for high-volume design. In addition, added parasitics to the package may impair the electrical performance of the redesigned die, thus preventing the die from meeting performance capabilities.

Accordingly, what is needed is a method and apparatus that provides an easy migration path from low volume silicon platforms, such as FPGA and platform ASICs, to lower cost silicon platforms, such as cell-based ASICs, while maintaining footprint compatibility with the existing chip package.

SUMMARY OF THE INVENTION

The present invention provides an embedded redistribution interposer for providing footprint compatible chip package migration in which a die designed to be mounted into chip package is originally implemented using a first type of silicon platform and is subsequently redesigned for a second type of silicon platform, resulting in a redesigned die being a different size than the original die and no longer compatible for mounting in the chip package. According to the present invention, the embedded redistribution interposer includes a substrate having a plurality of bond pads on a top side thereof, wherein the redesigned die is mounted to the top of the interposer substrate, and the bottom of the interposer substrate is mounted to the substrate of the chip package. The redesigned die is connected to the redistribution interposer via a first set of electrical connections coupled between the die and the interposer bond pads. The redistribution interposer is then connected to the package via a second set of electrical connections coupled between the interposer bond pads and a package substrate, wherein signals from the die are redistributed in a manner that increases die fan-out without violating assembly rules, thereby eliminating the need to redesign the chip package to accommodate the redesigned die.

According to the method and system disclosed herein, the present invention provides an easy migration path from low volume silicon platforms, such as FPGA and platform ASICs, to lower cost silicon platforms, such as cell-based ASICs, while maintaining footprint compatibility with the existing package, thereby enabling the use of existing PCB layouts without the need for re-design and potential market window loss.

DETAILED DESCRIPTION OF THE INVENTION

The present invention relates to a redistribution interposer card. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention enables chip migration to occur in a manner that maintains footprint compatibility for the chip package. Chip migration occurs when a die is originally implemented using a first type of silicon platform and is subsequently redesigned using a second type of silicon platform (e.g., FPGA to platform ASIC or Platform ASIC to full cell-based ASIC). The redesigned die is typically smaller in than the original die, and usually less expensive and more reliable, but results in higher substrate routing congestion, complexities in wire bond interconnect and may no longer be compatible for mounting in the original chip package.

The present invention provides an embedded interposer card that acts as a redistribution layer between redesigned die and the substrate of the original chip package to eliminate assembly and substrate related design constraints. One set of electrical connections connect the die to the interposer, and a second set of electrical connections connect the interposer to the chip package. Accordingly, the embedded redistribution interposer of the present invention enables the die to interconnect to the main package substrate via the interposer, resulting in footprint compatibility with the original package design. Thus, use of the redistribution interposer within the chip package not only eliminates the need to redesign the chip package, but also the PCB board to which the chip package is designed to attach.

Figure 4:
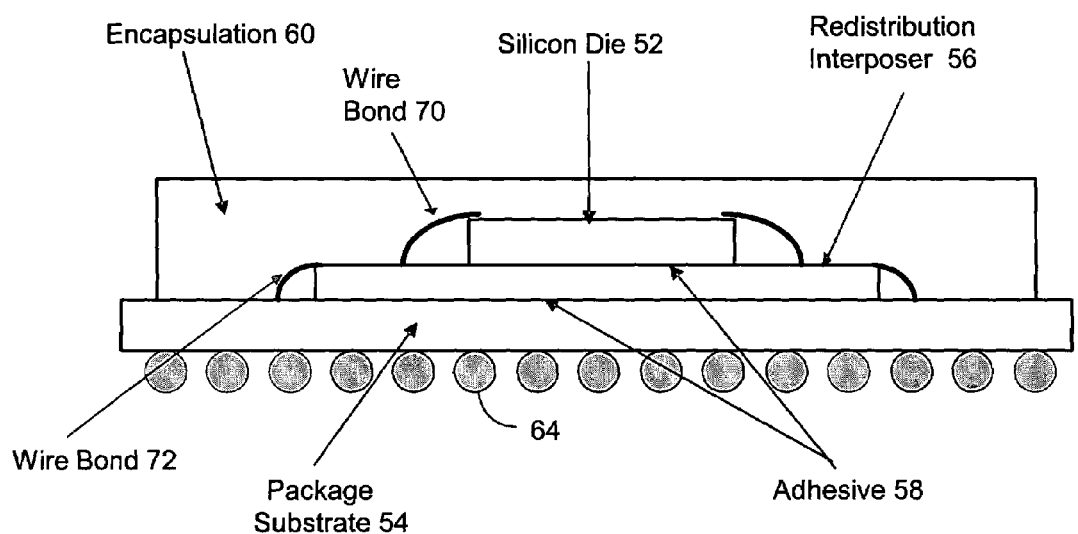
FIG. 4 is a side view of top view of a chip package having the embedded redistribution interposer in accordance with a preferred embodiment of the present invention.
Figure 5:
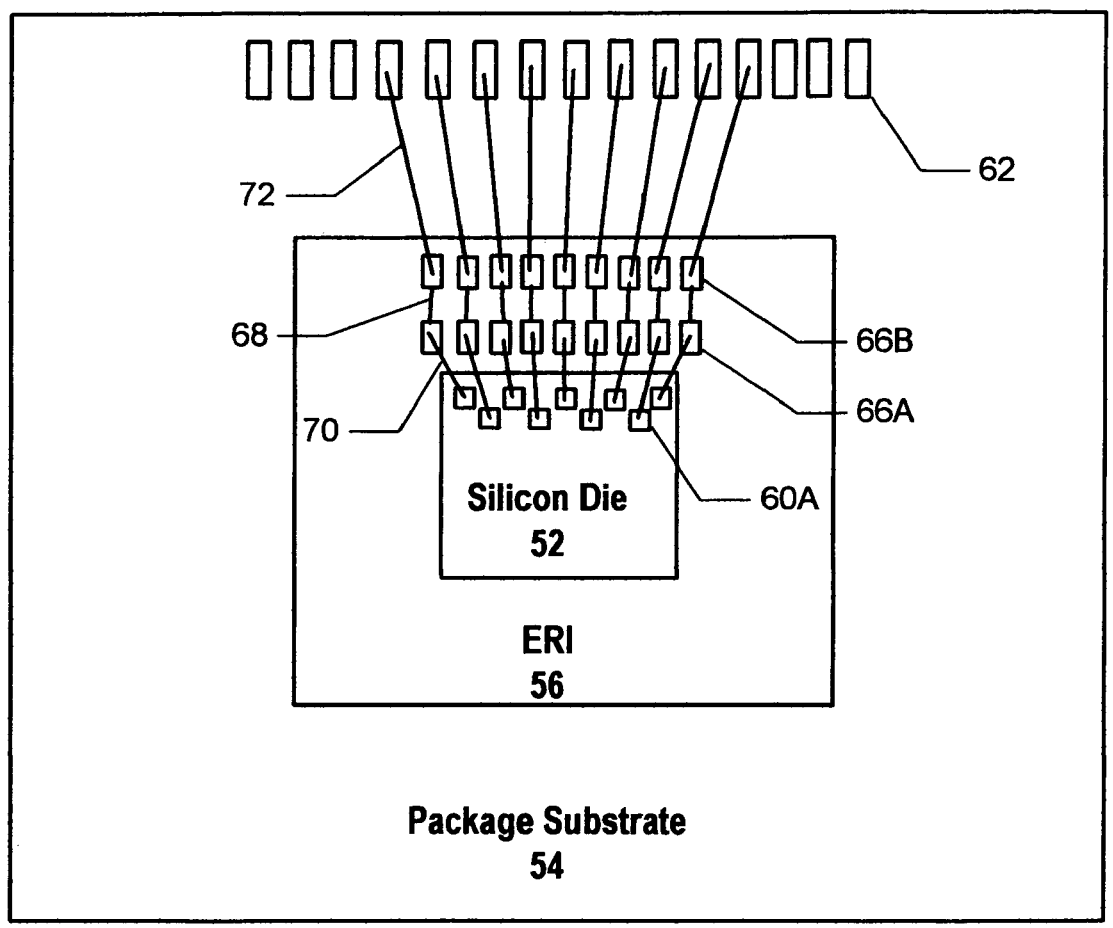
FIG. 5 is a top view of the chip package having the embedded redistribution interposer.

FIG. 4 is a side view of a chip package having the embedded redistribution interposer in accordance with a preferred embodiment of the present invention, and FIG. 5 is a top view of the chip package. The chip package 50 includes a redesigned die 52, and a package substrate 54. According to the present invention, the chip package 50 further includes a redistribution interposer 56 embedded in the package 50 between the redesigned die 52 and the package substrate 54. The redesigned die 52 attaches to the top of the redistribution interposer 56 and the bottom of the redistribution interposer 56 attaches to the top of the package substrate 54, preferably using adhesive 58. The redesigned die 52 and the redistribution interposer 56 are enclosed in the package 50 by encapsulation (note, if done with flip-chip bump interconnect, encapsulation is not the only method of sealing the package) 60. In a preferred embodiment of the present invention, the interposer 56 is larger in size than the die 52, but smaller than the package substrate 54, and the substrate comprising the interposer 56 may be any material that can route signals and act as a bonding tier. Example substrate materials include, but are not limited to, silicon, ceramic and organic substrates.

Figure 1:
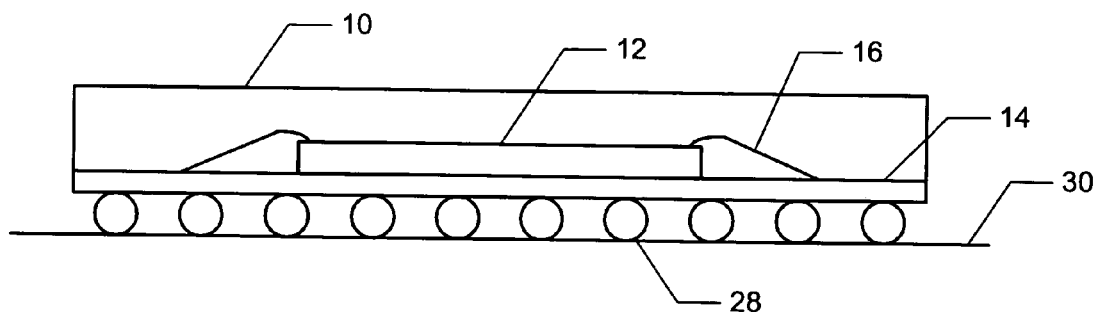
FIG. 1 is a cross-section view of a conventional wire bond package.
Figure 2:
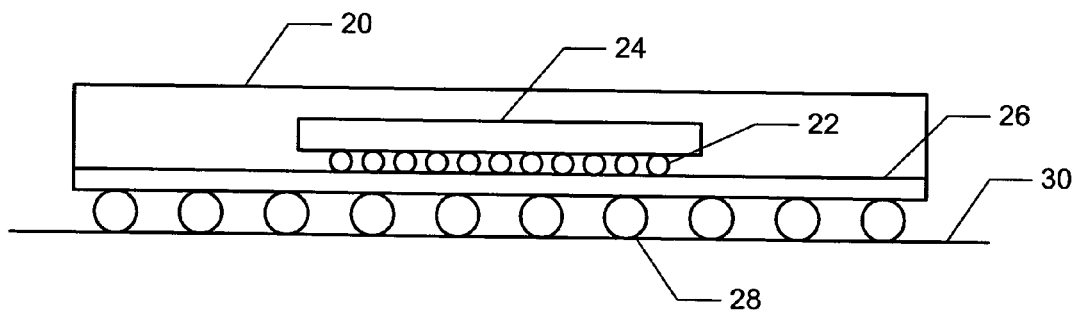
FIG. 2 is a cross-section view of a conventional flip-chip package.
Figure 3:
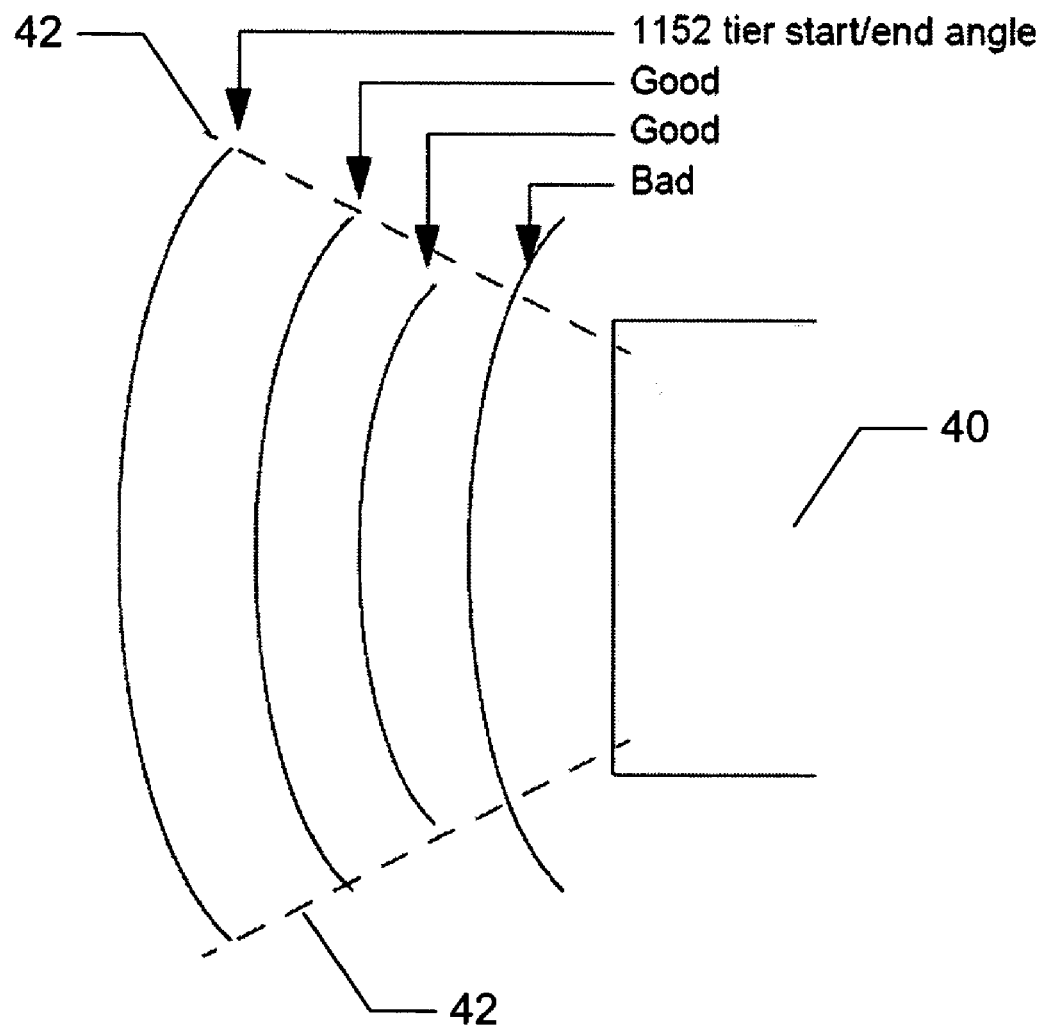
FIG. 3 is a diagram illustrating one example of a package design issue that can arise during die migration of a die to a smaller die.

As shown in FIG. 5, the redesigned die 52 includes bond pads 60a along its edges that need to be wire bonded to different tiers of bond pads 62 on the package substrate 54 (see FIG. 3), which via down to solder balls 64 on the underside of the package 50. To maintain compliance with assembly and fan-out rules when connecting the smaller die 52 to the existing package substrate 54, the redistribution interposer 56 preferably includes inner bond pads 66a, and outer bond pads 66b located along the edges thereof, wherein each pair of inner and outer bond pads 66a and 66b are interconnected via jumpers 68. The die 52 is connected to the redistribution interposer 56 with a first set of wire bonds 70 that are connected between the die bond pads 60a and inner bond pads 66a. The redistribution interposer 56 is connected to the package substrate 54 with a second set of wire bonds 72 that are connected between the outer bond pads 66b and the package bond pads 62 to redistribute the signals from the die 52 in a manner that increases die fan-out without violating assembly rules.

In an alternative embodiment, rather than having pairs of inner bond pads 66a and corresponding outer bond pads 66b connected by jumpers 68, the redistribution interposer 56 may be implemented where each pair of bond pads 66a and 66b is formed as one long single bond pad 66. In this embodiment, wire bonds 70 connect signals from the die bond pads 60 to the interposer bond pads 66, and wire bonds 72 connect signals from the interposer bond pads 66 to the package bond pads 62.

Figure 6:
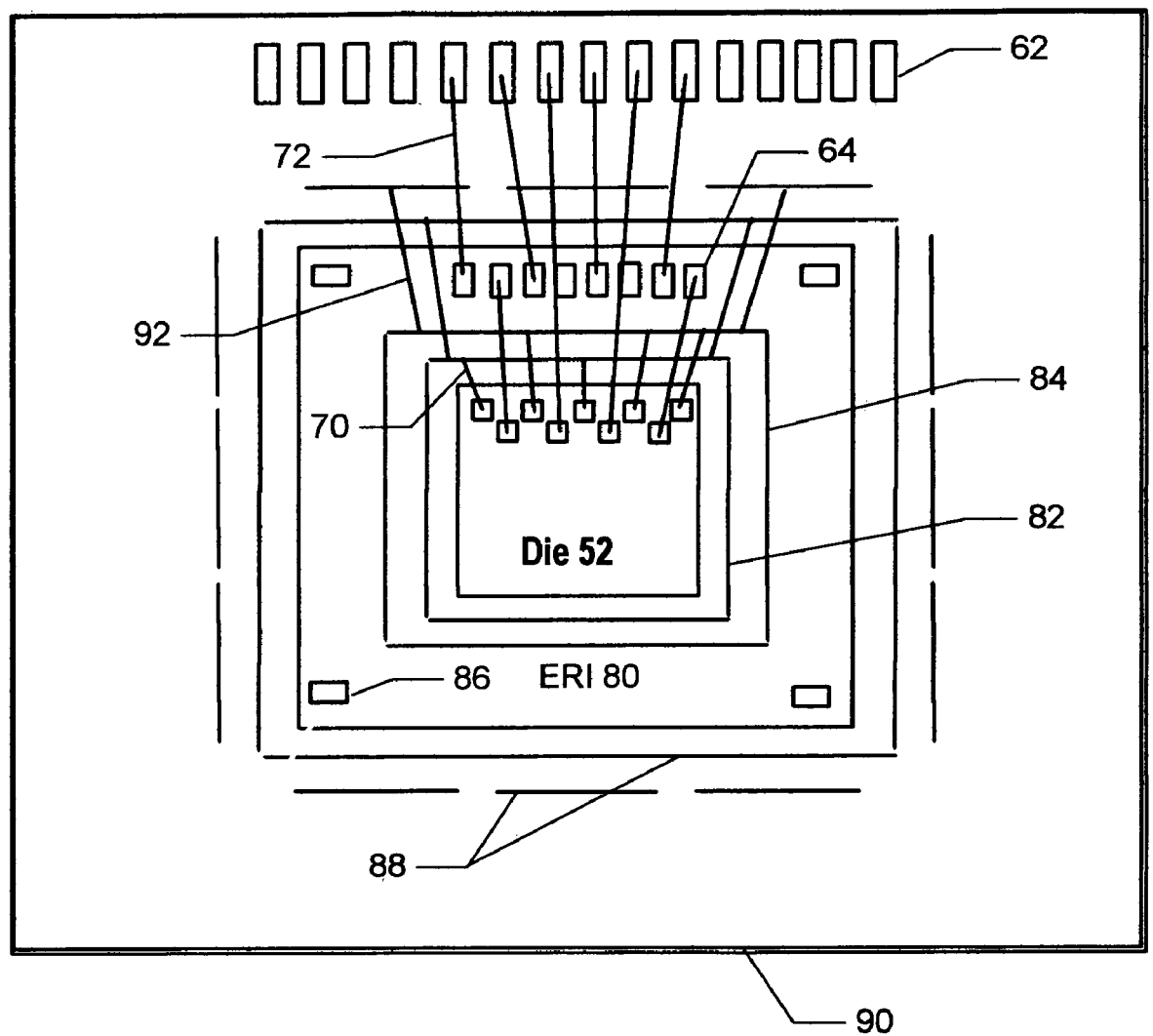
FIG. 6 is a diagram showing an embedded redistribution interposer with power and ground rings in accordance with a second embodiment of the present invention.

Referring now to FIG. 6, a second embodiment of the present invention shown, where like components from FIGS. 4 and 5 have like reference numerals. In the second embodiment, an embedded redistribution interposer 80 is provided with power and ground rings 82 and 84, and passives 86, such as capacitors. Power and ground signals from the die 52 connect to power and ground rings 82 and 84 of the interposer 80 using the first set of wire bonds 70. As in the first embodiment, interposer bond pads 64 are connected to the package bond pads 62 using a second set of wire bonds 72. In addition, a third set of wire bonds 92 is used to connect the power and ground rings 82 and 84 of the interposer 80 to power and ground islands 88 on the package substrate 90. In a further embodiment, some of the interposer bond pads 64 may be provided so that they via down to contacts in the package substrate, providing a more direct connection to solder balls 64.

Placing power and ground on the interposer 80 according to the present invention provides several advantages. For example, in a typical package, there are many wire bond connections between the die and power and ground on the package substrate 90. Moving some of those power and ground connections from the substrate 90 to the intermediate layer of the interposer 80 in accordance with the present invention reduces wire congestion, thus reducing inductive coupling due to short wire lengths from the die to the interposer.

An additional benefit of the present invention is that it reduces the cost of the package. The original package may have had densely packed bond pads 62, which is expensive to produce. With the present invention, some of the package bond pads 62 may be relocated to the interposer. Therefore, the remaining bond pads 62 on the package substrate may be spread out, thereby reducing cost.

A redistribution interposer has been disclosed that is embedded between the redesigned die and the package substrate that was designed for the original die. Pads from the die and pads on the interposer are connected via standard wire bond assembly. Secondary wire bonding connects signals from the interposer to the package substrate. According to the present invention, the embedded interposer acts as a redistribution layer for signals from the die to the package substrate, which reduces congestion, increases radial fan-out, and enables footprint compatible package design.

Because the embedded redistribution interposer uses standard packaging materials and standard assembly processes, the overall cost of the converted product is reduced, and the customer is provided with a footprint compatible low-cost ASIC solution that is compatible with their existing PCB board. Thus, present invention provides a low cost, time-to-market solution.

Although the present invention has been described in terms of a preferred embodiment of the wire bond package, those with ordinary skill in the art will readily recognize that the embedded redistribution interposer can be used with flip-chip packaging as well, wherein instead of wire bond interconnects between the die/interposer/substrate, solder bump interconnects are used.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. An embedded redistribution interposer for providing footprint compatible chip package migration in which a die designed for mounting into a chip package with footprint compatibility with a first type of silicon platform is originally implemented using the first type of silicon platform and is subsequently redesigned for a second type of silicon platform, resulting in a redesigned die being a different size than the original die and no longer compatible for mounting in the chip package, the embedded redistribution interposer comprising:

an interposer substrate having top and bottom sides, wherein the redesigned die for the second type of silicon platform is mounted on the top side of the interposer substrate, and the bottom side of the interposer substrate is mounted to a substrate of the chip package with footprint compatibility with the first type of silicon platform;

a plurality of bond pads;

a first set of electrical connections coupled between the redesigned die and the plurality of bond pads to connect the redesigned die to the redistribution interposer; and a second set of electrical connections coupled between the plurality of bond pads and the chin package substrate to connect the redistribution interposer to the chip package, wherein signals from the redesigned die are redistributed from the redesigned die such that die fan-out is increased without violating assembly rules, thereby eliminating the need to redesign the chip package to accommodate the redesigned die.

2. The redistribution interposer of claim 1 wherein the plurality of bond pads include pairs of inner bond pads and outer bond pads, wherein each pair of inner and outer bond pads are interconnected via jumpers.

3. The redistribution interposer of claim 2 wherein the redesigned die is connected to the redistribution interposer with a first set of wire bonds that are connected between die bond pads and the inner bond pads.

4. The redistribution interposer of claim 3 wherein the redistribution interposer is connected to the chip package substrate with a second set of wire bonds that are connected between the outer bond pads and chip package bond pads.

5. The redistribution interposer of claim 1 wherein the plurality of bond pads are implemented as a set of long bond pads wherein a first set of wire bonds connect signals from die bond pads to the interposer long bond pads, and a second set of wire bonds connect signals from the interposer bond pads to the package bond pads.

6. The redistribution interposer of claim 1 wherein the chip package includes solder balls for connection to a PCB board with a footprint compatibility to the first type of silicon platform, wherein due to the footprint compatibility of the chip package provided by the redistribution interposer, the PCB does not have to be redesigned for the redesigned die.

7. The redistribution interposer of claim 6 wherein a portion of the redistribution interposer bond pads via down to contacts in the chip package substrate, providing a more direct connection to the solder balls.

8. The redistribution interposer of claim 1 wherein the redistribution interposer is larger in size than the redesigned die, but smaller than the chip package substrate.

9. The redistribution interposer of claim 1 wherein the redistribution interposer comprises a material that can route signals and act as a bonding tier.

10. The redistribution interposer of claim 1 wherein at least one of the first and second set of electrical connections is coupled to solder balls.

11. A chip package, comprising:
- a chip package substrate comprising bond pads and a pin-out connecting the chip package substrate to a board, wherein the chip package substrate is footprint compatible with a first type of silicon platform;
- a redesigned die that was originally designed for the first type of silicon platform for mounting in the chip package substrate and was subsequently migrated to a second silicon platform, resulting in a smaller form factor;
- a redistribution interposer embedded between the chip package substrate and the redesigned die, the redistribution interposer comprising:
- a plurality of interposer bond pads;
- a first plurality of wire bonds coupled between the redesigned die and the plurality of interposer bond pads;
- a second plurality of wire bonds coupled between the interposer bond pads and the bond pads on the chip package substrate, thereby redistributing signals from the redesigned die and increasing radial fan-out, thereby maintaining footprint compatibility with the chip package substrate and eliminating need to redesign the chip package or the board to accommodate the designed die.

12. The chip package of claim 11 wherein the plurality of interposer bond pads include pairs of inner bond pads, and outer bond pads, wherein each pair of inner and outer bond pads are interconnected via jumpers.

13. The chip package of claim 12 wherein the first set of wire bonds are connected between die bond pads and the inner bond pads.

14. The chip package of claim 13 wherein the second set of wire bonds are connected between the outer bond pads and chip package bond pads.

15. The chip package of claim 11 wherein the chip package comprises solder balls for connection to the board.

16. The chip package of claim 15 wherein a portion of the interposer bond pads via down to contacts in the chip package substrate, providing a more direct connection to the solder balls.

17. The chip package of claim 11 wherein the redistribution interposer is larger in size than the die, but smaller than the chip package substrate.

18. The chip package of claim 11 wherein the redistribution interposer comprises a material that can route signals and act as a bonding tier.

19. A method for providing die migration from a first type of silicon platform to a second type of silicon platform while maintaining chip package footprint compatibility, comprising:
- (a) redesigning a die originally designed for mounting in a chip package substrate with footprint compatibility with the type of silicon platform from the first type silicon platform to the second type of silicon platform, resulting in a redesigned die having a smaller form factor than the original die, wherein the chip package substrate comprises a substrate having a plurality of bond pads thereon;
- (b) embedding a redistribution interposer between the chip package substrate and the redesigned die;
- (c) providing the redistribution interposer with a plurality of bond pads;
- (d) coupling a first plurality of wire bonds between the redesigned die and the interposer bond pads; and
- (e) coupling a second plurality of wire bonds between the interposer bond pads and the bond pads on the chip package substrate, thereby redistributing signals from the redesigned die and increasing radial fan-out, thereby maintaining footprint compatibility with the chip package substrate and eliminating need to redesign the chip package to accommodate the redesigned die.

* * * * *